(12) United States Patent
Tanaka

(10) Patent No.: US 12,395,142 B2
(45) Date of Patent: Aug. 19, 2025

(54) RESONANT DEVICE, FILTER, AND MODULE

(71) Applicant: Murata Manufacturing Co., Ltd., Nagaokakyo (JP)

(72) Inventor: Akira Tanaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 337 days.

(21) Appl. No.: 18/101,714

(22) Filed: Jan. 26, 2023

(65) Prior Publication Data

US 2023/0179167 A1    Jun. 8, 2023

Related U.S. Application Data

(63) Continuation of application No. PCT/JP2021/032070, filed on Sep. 1, 2021.

(30) Foreign Application Priority Data

Sep. 29, 2020 (JP) .................. 2020-163254

(51) Int. Cl.
*H03H 7/01* (2006.01)
*H01F 27/28* (2006.01)
(Continued)

(52) U.S. Cl.
CPC ....... *H03H 7/0115* (2013.01); *H01F 27/2804* (2013.01); *H01G 4/012* (2013.01);
(Continued)

(58) Field of Classification Search
CPC ......... H03H 2001/0085; H03H 7/0115; H03H 7/463; H01P 1/20345; H01P 1/2135; H01G 4/30
(Continued)

(56) References Cited

U.S. PATENT DOCUMENTS 5,703,544 A * 12/1997 Hays, III ............ H01P 1/20381
333/204
2017/0093358 A1    3/2017 Imamura
(Continued)

FOREIGN PATENT DOCUMENTS

CN         101421918 A     4/2009
EP         2009787 A1     12/2008
(Continued)

OTHER PUBLICATIONS

International Search Report in PCT/JP2021/032070, mailed Nov. 2, 2021, 3 pages.
Written Opinion in PCT/JP2021/032070, mailed Nov. 2, 2021, 4 pages.
Official Communication issued in corresponding Chinese Patent Application No. 202180056160.6, mailed on Jun. 3, 2025, 6 pages.

*Primary Examiner* — Rakesh B Patel
(74) *Attorney, Agent, or Firm* — Keating & Bennett, LLP

(57) ABSTRACT

In a resonant device, a first via electrode and a second via electrode connect a first plane electrode and a third plane electrode. A third via electrode and a fourth via electrode connect the first plane electrode and a second plane electrode. When the first plane electrode is seen in plan view in a normal direction of the first plane electrode, a first imaginary line connecting the first via electrode and the second via electrode intersects with a second imaginary line connecting the third via electrode and the fourth via electrode.

20 Claims, 10 Drawing Sheets

(51) Int. Cl.
    *H01G 4/012*     (2006.01)
    *H01G 4/30*     (2006.01)
    *H01P 1/203*     (2006.01)
    *H03H 7/03*     (2006.01)
    *H03H 7/46*     (2006.01)

(52) U.S. Cl.
    CPC ........... *H01G 4/30* (2013.01); *H01P 1/20345* (2013.01); *H03H 7/03* (2013.01); *H03H 7/463* (2013.01)

(58) Field of Classification Search
    USPC .................... 333/126, 175, 185, 204, 205
    See application file for complete search history.

(56) References Cited

U.S. PATENT DOCUMENTS

| | | |
|---|---|---|
| 2019/0372542 A1 | 12/2019 | Kobayashi et al. |
| 2020/0243254 A1 | 7/2020 | Imamura |
| 2021/0242851 A1 | 8/2021 | Yasuda et al. |

FOREIGN PATENT DOCUMENTS

| | | |
|---|---|---|
| JP | 2017063394 A | 3/2017 |
| JP | 6338784 B1 | 6/2018 |
| WO | 2019087739 A1 | 5/2019 |
| WO | 2020105257 A1 | 5/2020 |

\* cited by examiner

RESONANT DEVICE, FILTER, AND MODULE

CROSS REFERENCE TO RELATED APPLICATIONS

This application claims the benefit of priority to Japanese Patent Application No. 2020-163254 filed on Sep. 29, 2020 and is a Continuation Application of PCT Application No. PCT/JP2021/032070 filed on Sep. 1, 2021. The entire contents of each application are hereby incorporated herein by reference.

BACKGROUND OF THE INVENTION

1. Field of the Invention

The present invention relates to a resonant device, a filter including the resonant device, and a module including the filter.

2. Description of the Related Art

Conventionally, resonant devices have been known. For example, International Publication No. 2020/105257 discloses a resonant device with a plurality of via electrodes formed inside a dielectric. The plurality of via electrodes constitute an inductor, and thus, a percentage of the dielectric in the resonant device increases. As a result, intensity of the resonant device can be increased.

SUMMARY OF THE INVENTION

In the resonant device disclosed in International Publication No. 2020/105257, one of two plane electrodes constituting a capacitor is connected to one via electrode, and thus, current flowing in the capacitor concentrates on the one via electrode. As a result, insertion loss of the resonant device may become worse.

Preferred embodiments of the present invention improve insertion loss of resonant devices.

A resonant device according to a preferred embodiment of the present invention includes a multilayer body, a first plane electrode, a second plane electrode, a third plane electrode, a first via electrode, a second via electrode, a third via electrode, and a fourth via electrode. The first plane electrode, the second plane electrode, and the third plane electrode are provided to the multilayer body. The third plane electrode is located between the first plane electrode and the second plane electrode in a normal direction of the first plane electrode. The first via electrode and the second via electrode connect the first plane electrode and the third plane electrode. The third via electrode and the fourth via electrode connect the first plane electrode and the second plane electrode. When the first plane electrode is seen in plan view in the normal direction of the first plane electrode, a first imaginary line connecting the first via electrode and the second via electrode intersects with a second imaginary line connecting the third via electrode and the fourth via electrode.

According to a resonant device of a preferred embodiment of the present invention, when the first plane electrode is seen in plan view in the normal direction of the first plane electrode, the first imaginary line connecting the first via electrode and the second via electrode intersects with the second imaginary line connecting the third via electrode and the fourth via electrode. Thus, insertion loss of the resonant device can be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
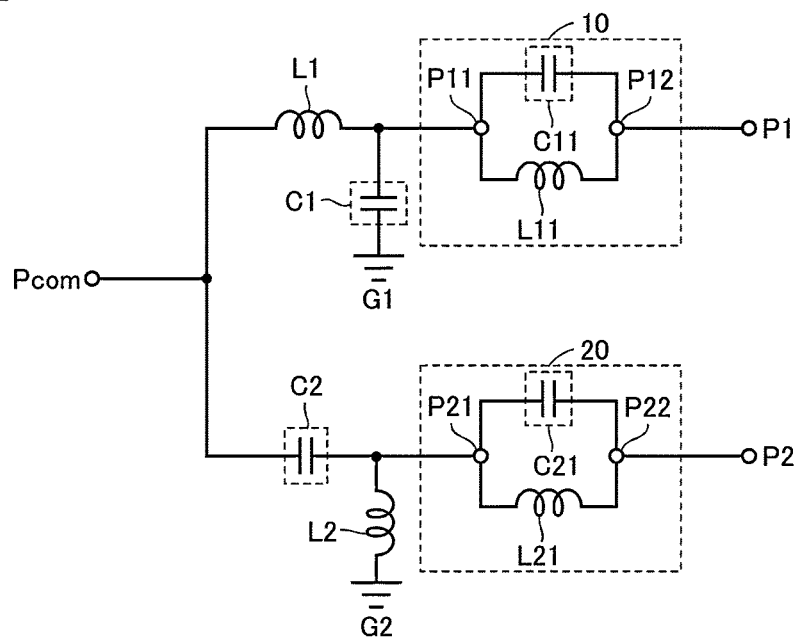
FIG. 1 is an equivalent circuit diagram of a diplexer as one example of a filter according to Preferred Embodiment 1 of the present invention.

Hereinafter, preferred embodiments are described in detail with reference to the drawings. Note that the same reference characters are given to the same or corresponding elements in the drawings, and description thereof is not repeated in general.

Preferred Embodiment 1

FIG. 1 is an equivalent circuit diagram of a diplexer 1 as one example of a filter according to Preferred Embodiment 1. As illustrated in FIG. 1, the diplexer 1 includes a common terminal Pcom, terminals P1 and P2, inductors L1 and L2, capacitors C1 and C2, and resonant devices 10 and 20. A resonant frequency of the resonant device 20 is different from a resonant frequency of the resonant device 10.

The resonant device 10 includes terminals P11 and P12, an inductor L11, and a capacitor C11. The inductor L11 and the capacitor C11 are connected in parallel between the terminals P11 and P12. The resonant device 10 includes an LC parallel resonant circuit.

The inductor L1 is connected between the common terminal Pcom and the terminal P11. The capacitor C1 is connected between a ground terminal G1, which is a ground point, and the terminal P11. The terminal P1 is connected to the terminal P12.

The resonant device 20 includes terminals P21 and P22, an inductor L21, and a capacitor C21. The inductor L21 and the capacitor C21 are connected in parallel between the terminals P21 and P22. The resonant device 20 includes an LC parallel resonant circuit.

The capacitor C2 is connected between the common terminal Pcom and the terminal P21. The inductor L2 is connected between a ground terminal G2, which is a ground point, and the terminal P21. The terminal P2 is connected to the terminal P22.

Figure 2:
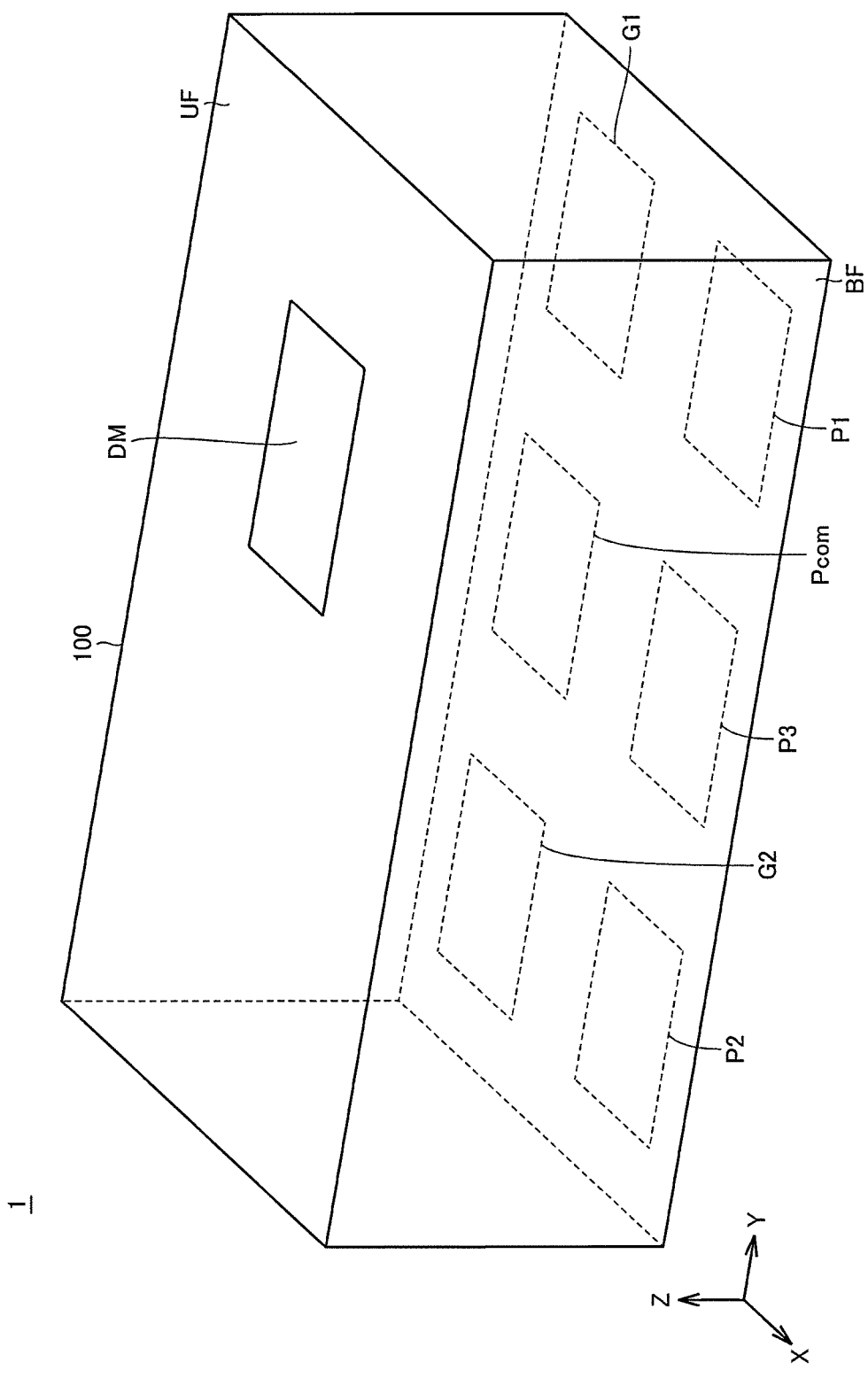
FIG. 2 is an external perspective view of the diplexer of FIG. 1.

FIG. 2 is an external perspective view of the diplexer 1 of FIG. 1. An X-axis, a Y-axis, and a Z-axis illustrated in FIG. 2 are orthogonal to each other, which is also the same in FIGS. 3 to 12. A plurality of dielectric layers are laminated in the Z-axis direction in a multilayer body 100. Inside the multilayer body 100, a plurality of electrodes defining the equivalent circuit illustrated in FIG. 1 are provided. That is, the diplexer 1 is included in a module where a plurality of electrodes are provided in the plurality of laminated dielectric layers.

As illustrated in FIG. 2, a direction distinguishing mark DM is located on an upper surface UF of the diplexer 1. The common terminal Pcom, the terminals P1, P2, and P3, and the ground terminals G1 and G2 are located on a bottom surface BF of the diplexer 1. The common terminal Pcom, the terminals P1 to P3, and the ground terminals G1 and G2 are, for example, land grid array (LGA) terminals where plane electrodes are regularly positioned on the bottom surface BF. The bottom surface BF of the diplexer 1 is connected to a circuit board (not illustrated).

Figure 3:
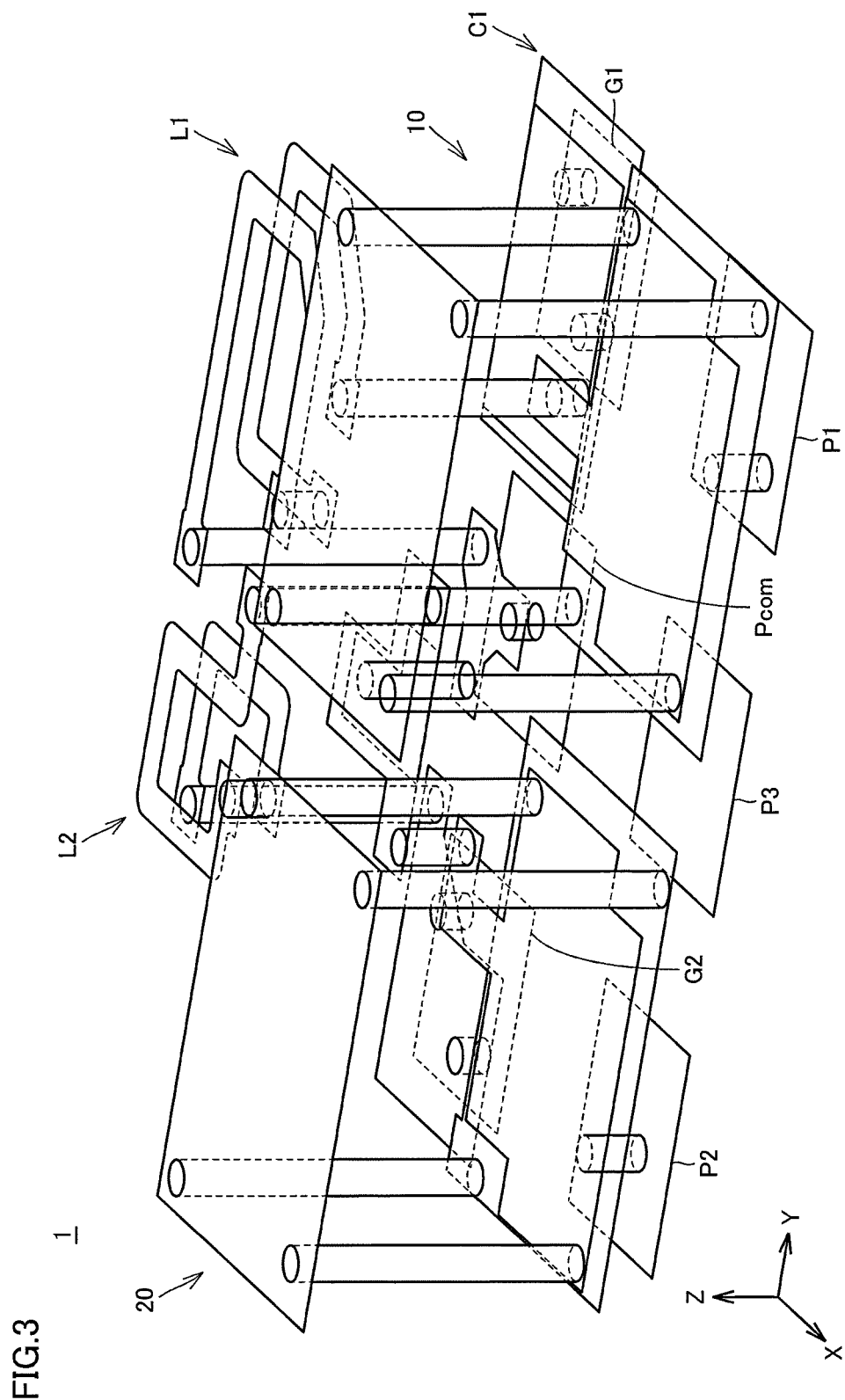
FIG. 3 is a perspective view of a plurality of electrodes located inside a multilayer body of FIG. 2.

FIG. 3 is a perspective view of a plurality of electrodes inside the multilayer body 100 of FIG. 2. In order to facilitate the understanding of an electrode structure including the plurality of electrodes, the plurality of electrodes illustrated in FIG. 3 will be described below while being divided into the plurality of electrodes of the resonant devices 10 and 20 and the plurality of electrodes of the inductors L1 and L2 and the capacitors C1 and C2.

Figure 4:
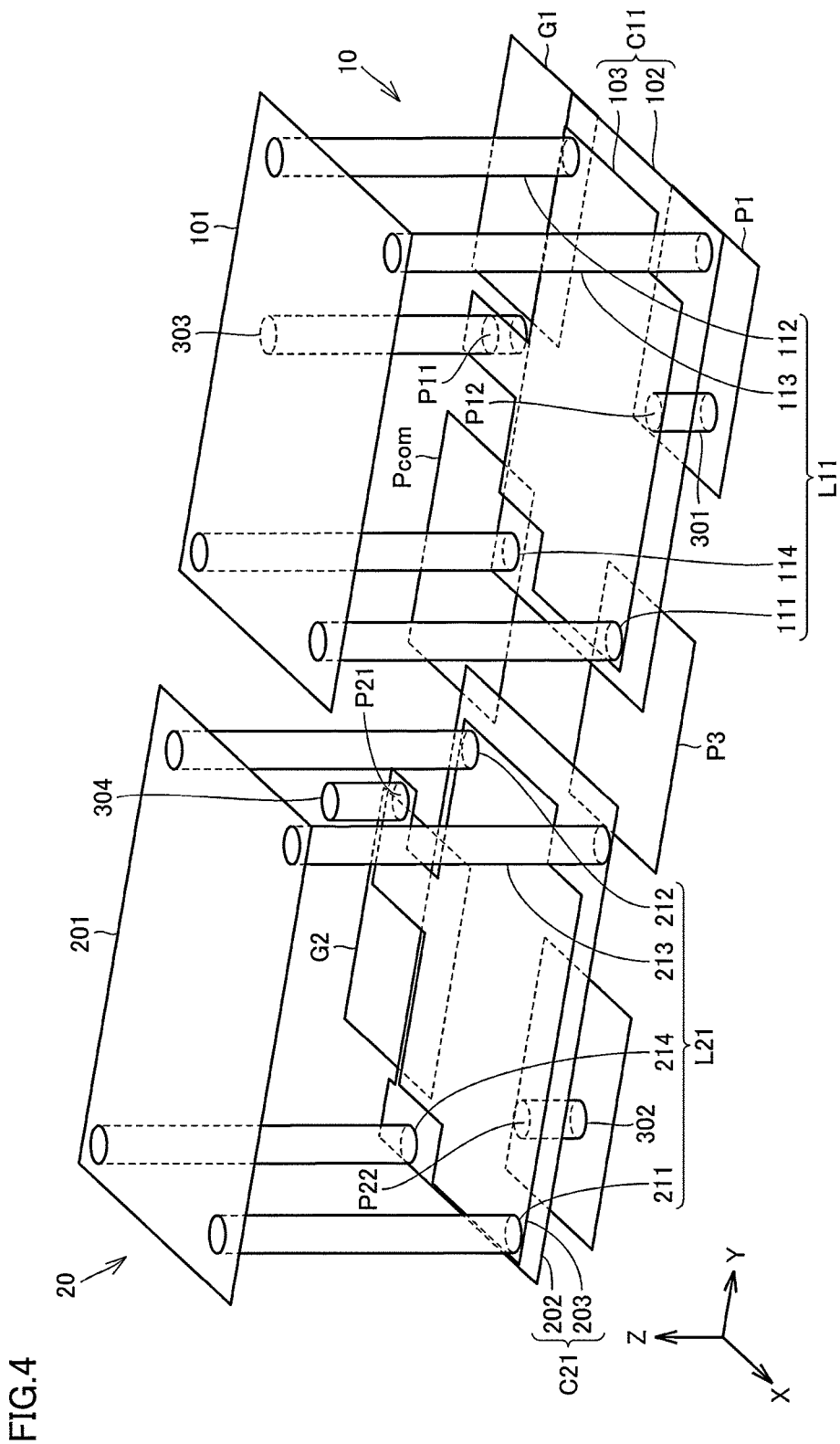
FIG. 4 is a perspective view of a plurality of electrodes of resonant devices of FIG. 3.
Figure 5:
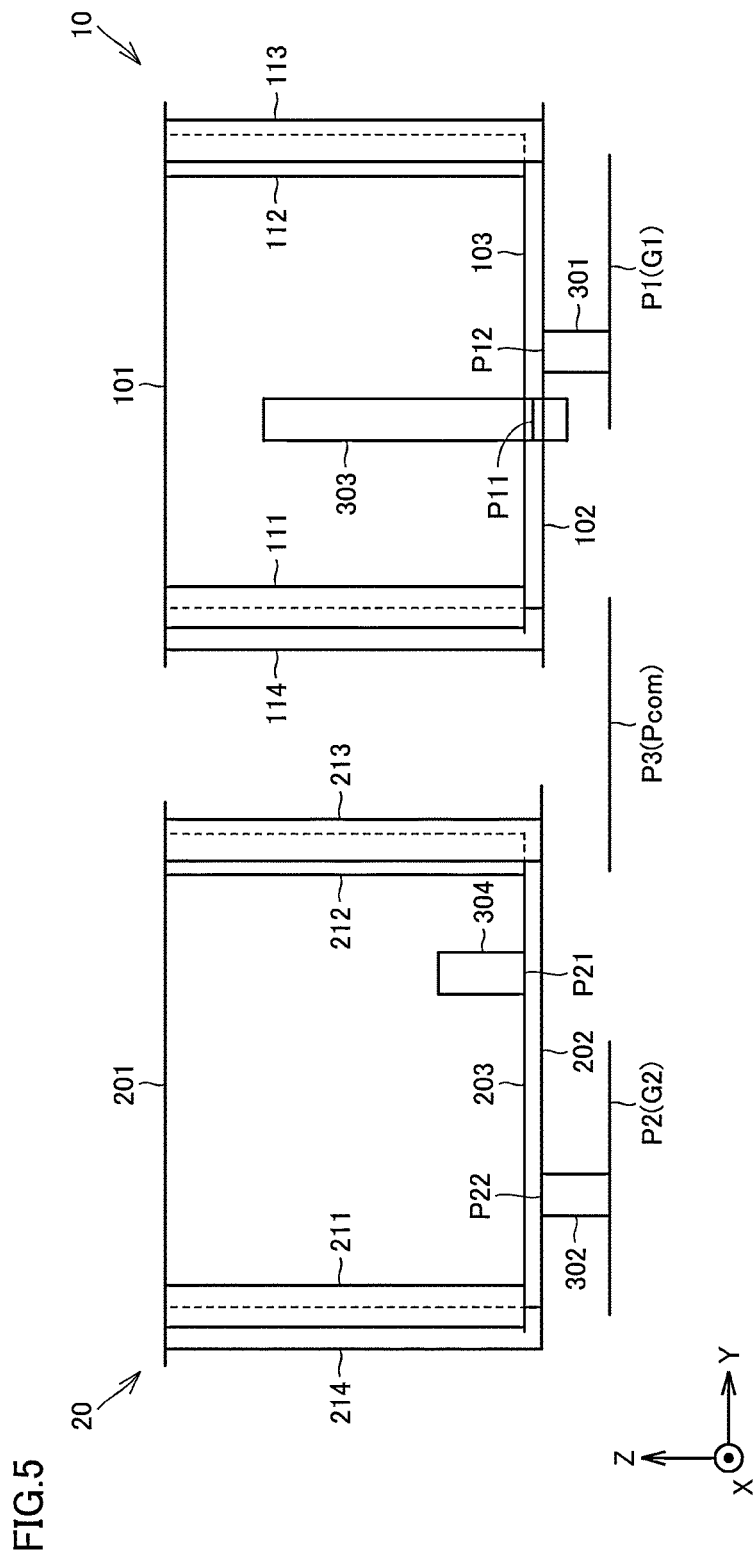
FIG. 5 is a plan view of the resonant devices of FIG. 4 when seen in an X-axis direction.
Figure 6:
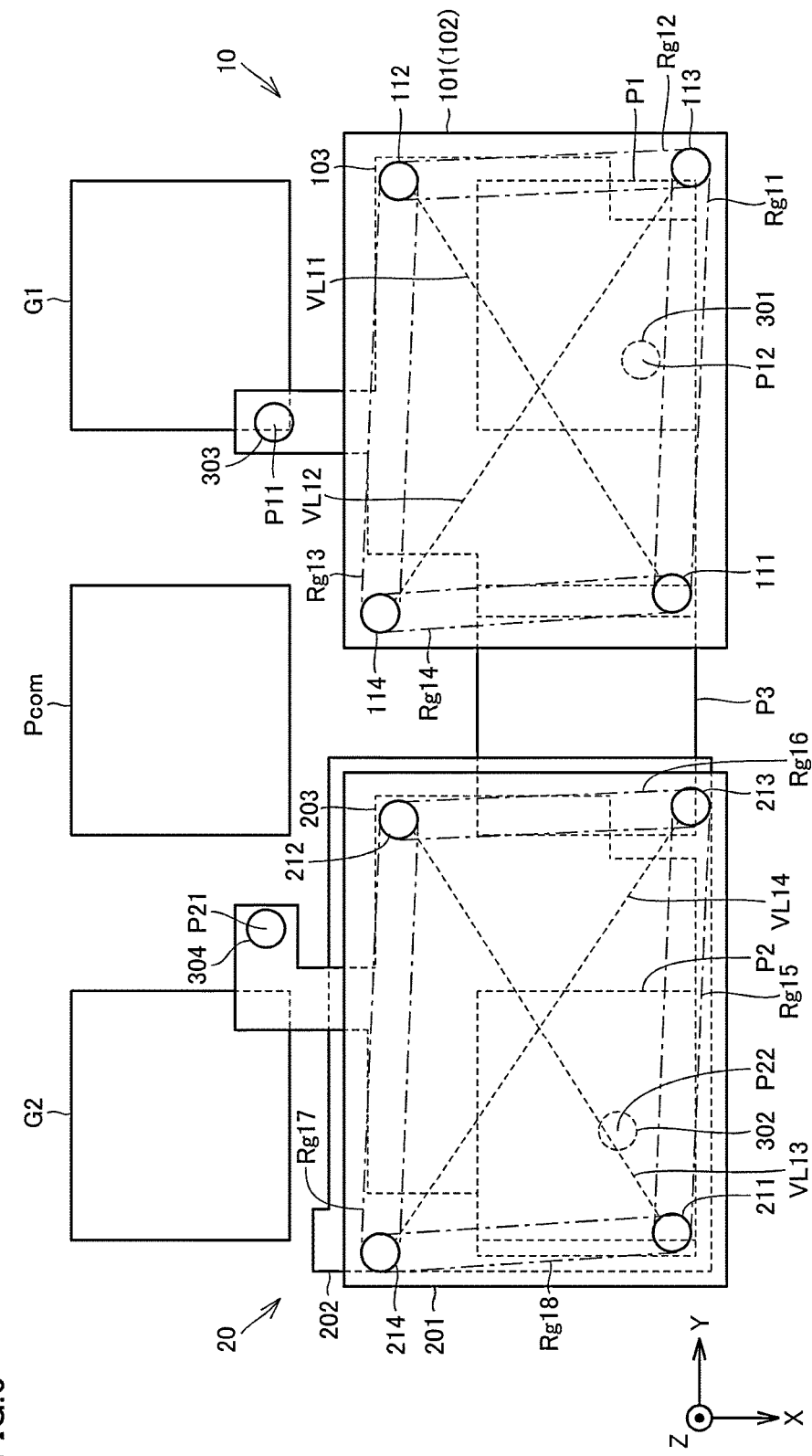
FIG. 6 is a plan view of the resonant devices of FIG. 4 when seen in a Z-axis direction.

FIG. 4 is a perspective view of the plurality of electrodes of the resonant devices 10 and 20 of FIG. 3. FIG. 5 is a plan view of the resonant devices 10 and 20 of FIG. 4 when seen in the X-axis direction. FIG. 6 is a plan view of the resonant devices 10 and 20 of FIG. 4 when seen in the Z-axis direction.

As illustrated in FIGS. 4 to 6, the resonant device 10 includes a plane electrode 101 (first plane electrode), a plane electrode 102 (second plane electrode), a plane electrode 103 (third plane electrode), a via electrode 111 (first via electrode), a via electrode 112 (second via electrode), a via electrode 113 (third via electrode), and a via electrode 114 (fourth via electrode).

The plane electrode 103 is located between the plane electrodes 101 and 102 in a normal direction (Z-axis direction) of the plane electrode 101. The via electrodes 111 and 112 extend in the Z-axis direction and connect the plane electrodes 101 and 103. The via electrodes 113 and 114 extend in the Z-axis direction and connect the plane electrodes 101 and 102.

The plane electrode 103 is connected to a via electrode 303. The terminal P11 is located at a connection between the plane electrode 103 and the via electrode 303. A via electrode 301 connects the plane electrode 102 and the terminal P1. The terminal P12 is located at a connection between the plane electrode 102 and the via electrode 301.

Each of the via electrodes 111 and 112 is shorter than each of the via electrodes 113 and 114. A distance between the plane electrodes 103 and 102 is shorter than a distance between the plane electrodes 103 and 101.

The via electrodes 111 to 114 define the inductor L11. The plane electrodes 102 and 103 are opposed to each other in the Z-axis direction and define the capacitor C11.

The resonant device 20 includes a plane electrode 201 (first plane electrode), a plane electrode 202 (second plane electrode), a plane electrode 203 (third plane electrode), a via electrode 211 (first via electrode), a via electrode 212 (second via electrode), a via electrode 213 (third via electrode), and a via electrode 214 (fourth via electrode).

The plane electrode 203 is located between the plane electrodes 201 and 202 in a normal direction of the plane electrode 201. The via electrodes 211 and 212 extend in the Z-axis direction and connect the plane electrodes 201 and 203. The via electrodes 213 and 214 extend in the Z-axis direction and connect the plane electrodes 201 and 202.

The plane electrode 203 is connected to a via electrode 304. The terminal P21 is located at a connection between the plane electrode 203 and the via electrode 304. A via electrode 302 connects the plane electrode 202 and the terminal P2. The terminal P22 is located at a connection between the plane electrode 202 and the via electrode 302.

Each of the via electrodes 211 and 212 is shorter than each of the via electrodes 213 and 214. A distance between the plane electrodes 203 and 202 is shorter than a distance between the plane electrodes 203 and 201.

The via electrodes 211 to 214 constitute the inductor L21. The plane electrodes 202 and 203 are opposed to each other in the Z-axis direction and define the capacitor C21.

As illustrated in FIG. 6, when the plane electrode 101 is seen in plan view in the Z-axis direction, the via electrode 111, a range Rg11 between the via electrodes 111 and 113, the via electrode 113, a range Rg12 between the via electrodes 113 and 112, the via electrode 112, a range Rg13 between the via electrodes 112 and 114, the via electrode 114, and a range Rg14 between the via electrodes 114 and 111 define a loop-shaped range. In the loop-shaped range, the via electrodes 111 and 112 connecting the plane electrodes 101 and 103 are disposed alternately with the via electrodes 113 and 114 connecting the plane electrodes 101 and 102. An imaginary line VL11 (first imaginary line) connecting the via electrodes 111 and 112 intersects with an imaginary line VL12 (second imaginary line) connecting the via electrodes 113 and 114.

A direction in which current flows in the via electrode 111 and a direction in which current flows in the via electrode 112 are the same as each other. A direction in which current flows in the via electrode 113 and a direction in which current flows in the via electrode 114 are the same as each other. The direction in which current flows in the via electrode 111 and the direction in which current flows in the via electrode 113 are opposite from each other.

A portion of the plane electrode 103 is not overlapped with the plane electrodes 101 and 102. The terminal P11 is located at the portion of the plane electrode 103 not overlapping with the plane electrodes 101 and 102.

When the plane electrode 201 is seen in plan view in the Z-axis direction, the via electrode 211, a range Rg15 between the via electrodes 211 and 213, the via electrode 213, a range Rg16 between the via electrodes 213 and 212, the via electrode 212, a range Rg17 between the via electrodes 212 and 214, the via electrode 214, and a range Rg18 between the via electrodes 214 and 211 form a loop-shaped range. In the loop-shaped range, the via electrodes 211 and 212 connecting the plane electrodes 201 and 203 are disposed alternately with the via electrodes 213 and 214 connecting the plane electrodes 201 and 202. An imaginary line VL13 (first imaginary line) connecting the via electrodes 211 and 212 intersects with an imaginary line VL14 (second imaginary line) connecting the via electrodes 213 and 214.

A direction in which current flows in the via electrode 211 and a direction in which current flows in the via electrode 212 are the same as each other. A direction in which current flows in the via electrode 213 and a direction in which current flows in the via electrode 214 are the same as each other. The direction in which current flows in the via electrode 211 and the direction in which current flows in the via electrode 213 are opposite from each other.

A portion of the plane electrode 203 is not overlapped with the plane electrodes 201 and 202. The terminal P21 is located at the portion of the plane electrode 203 not overlapping with the plane electrodes 201 and 202.

Figure 7:
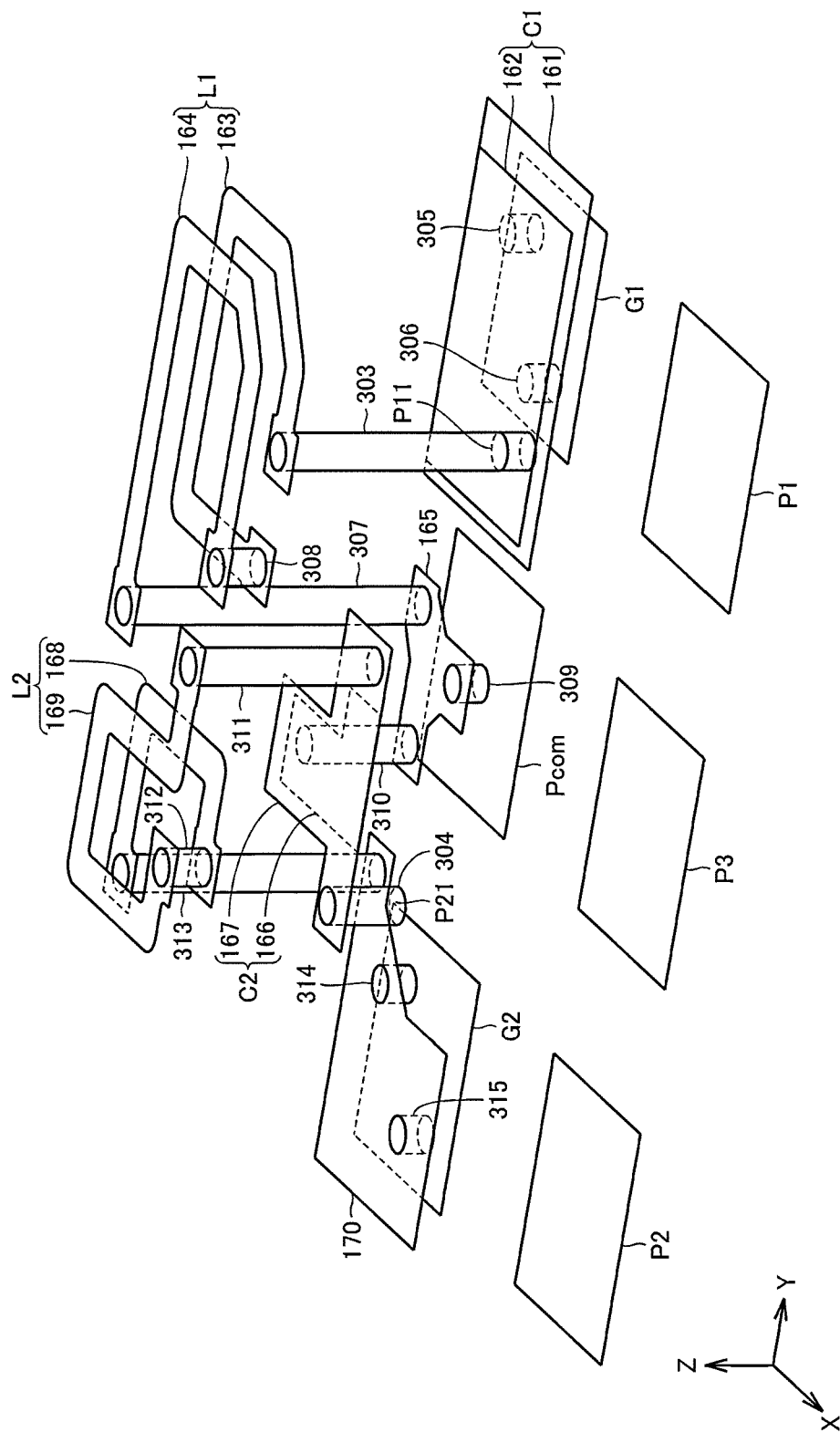
FIG. 7 is a perspective view of a plurality of electrodes of inductors and capacitors of FIG. 3.

FIG. 7 is a perspective view of the plurality of electrodes of the inductors L1 and L2 and the capacitors C1 and C2 of FIG. 3. As illustrated in FIG. 7, a plane electrode 161 is connected to the ground terminal G1 by via electrodes 305 and 306. A plane electrode 162 is opposed to the plane electrode 161 in the Z-axis direction. The plane electrodes 161 and 162 define the capacitor C1.

Line electrodes 163 and 164 wind around an axis extending in the Z-axis direction. The line electrode 163 is connected to the plane electrode 162 by the via electrode 303. The line electrode 163 is connected to the line electrode 164 by a via electrode 308. The line electrode 164 is connected to a plane electrode 165 by a via electrode 307. The line electrodes 163 and 164 define the inductor L1.

The plane electrode 165 is connected to the common terminal Pcom by a via electrode 309. The plane electrode 165 is connected to a plane electrode 166 by a via electrode 310. The plane electrode 166 is opposed to a plane electrode 167 in the Z-axis direction. The plane electrodes 166 and 167 define the capacitor C2.

Line electrodes 168 and 169 wind around an axis extending in the Z-axis direction. The line electrode 168 is connected to the plane electrode 130 by a via electrode 313. The line electrode 168 is connected to the line electrode 169 by a via electrode 312. The line electrode 169 is connected to the plane electrode 167 by a via electrode 311. The line electrodes 168 and 169 define the inductor L2. A plane electrode 170 is connected to the ground terminal G2 by via electrodes 314 and 315.

Figure 8:
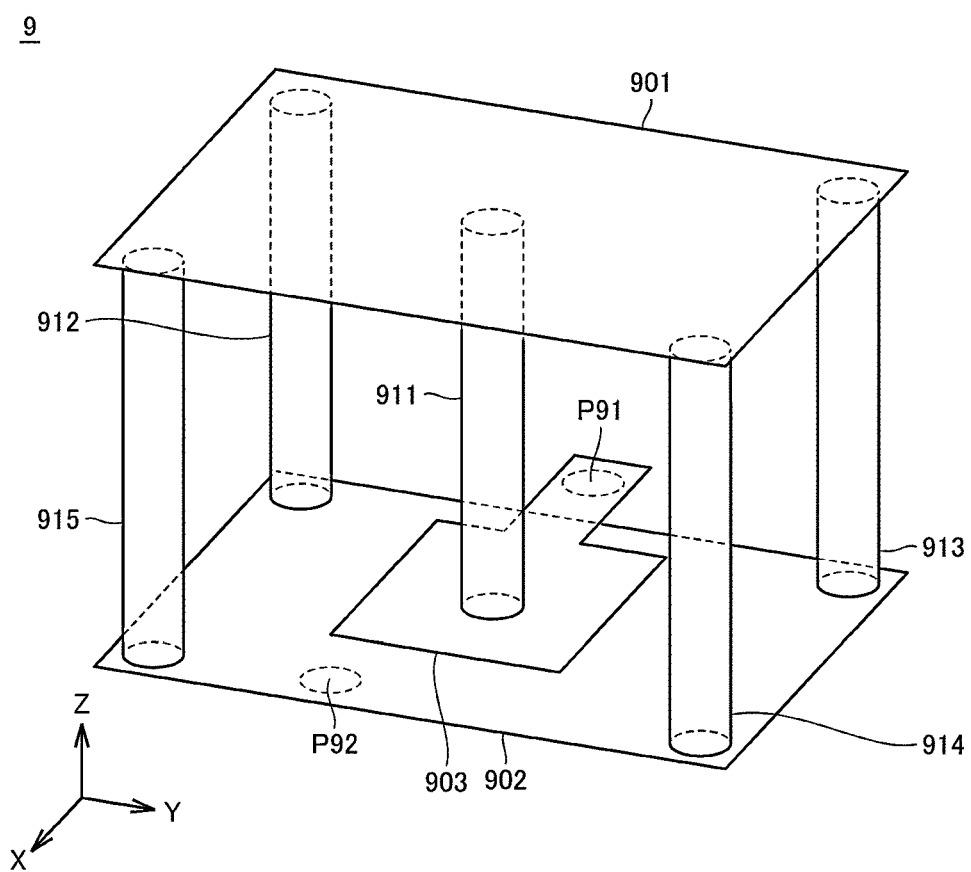
FIG. 8 is a perspective view of a plurality of electrodes of a resonant device according to a comparative example.

FIG. 8 is a perspective view of a plurality of electrodes of a resonant device 9 according to a comparative example. As illustrated in FIG. 8, the resonant device 9 includes plane electrodes 901, 902, and 903 and via electrodes 911, 912, 913, 914, and 915.

The plane electrode 903 is located between the plane electrodes 901 and 902 in a normal direction of the plane electrode 901. The via electrode 911 extends in the Z-axis direction and connects the plane electrodes 901 and 903. The via electrodes 912 to 915 extend in the Z-axis direction and connect the plane electrodes 901 and 902. The via electrodes 912 and 913 are positioned along the Y-axis direction. The via electrodes 913 and 914 are positioned along the X-axis direction. The via electrodes 914 and 915 are positioned along the Y-axis direction. The via electrodes 915 and 912 are positioned along the X-axis direction.

The via electrode 911 is shorter than each of the via electrodes 912 to 915. A distance between the plane electrodes 903 and 902 is shorter than a distance between the plane electrodes 903 and 901.

The via electrodes 911 to 915 define an inductor. The plane electrodes 902 and 903 are opposed to each other in the Z-axis direction and constitute a capacitor.

The plane electrode 903 includes a portion located between the via electrodes 912 and 913. A terminal P91 is located at the portion. A terminal P92 is located in or on the plane electrode 902.

In the resonant device 9, the plane electrodes 901 and 903 are connected by the via electrode 911. Therefore, current flowing in the capacitor including the plane electrodes 901 and 903 concentrates on the via electrode 911. As a result, insertion loss of the resonant device 9 may become worse.

In this respect, in the resonant device according to the present preferred embodiment, when the first plane electrode is seen in plan view in the normal direction of the first plane electrode, the plurality of via electrodes connecting the first plane electrode and the third plane electrode and the plurality of via electrodes connecting the first plane electrode and the second plane electrode are disposed alternately in the loop-shaped range, and the first imaginary line and the second imaginary line intersect with each other. Since the first plane electrode and the third plane electrode are connected to each other by the plurality of via electrodes, current flowing in the capacitor including the second plane electrode and the third plane electrode is distributed to the plurality of via electrodes connecting the first plane electrode and the third plane electrode. As a result, insertion loss of the resonant device can be improved compared with the insertion loss of the resonant device according to the comparative example.

Moreover, the flowing direction of the current in the plurality of via electrodes connecting the first plane electrode and the third plane electrode is opposite from the flowing direction of the current in the plurality of via electrodes connecting the first plane electrode and the second plane electrode. Thus, directions of magnetic fields generated from the two via electrodes adjacent to each other in the loop-shaped range also become opposite from each other. Since mutually independent magnetic fields are generated from the plurality of via electrodes disposed in the loop-shaped range, coupling between the resonant device and other circuit devices can be reduced or prevented.

As described above, the resonant device according to Preferred Embodiment 1 can improve the insertion loss of the resonant device.

Preferred Embodiment 2

Preferred Embodiment 2 describes the configuration in which a width of the third plane electrode is increased and manufacturing variations in characteristics of the resonant device and a risk of short circuiting between the first plane electrode and the second plane electrode are reduced.

Figure 9:
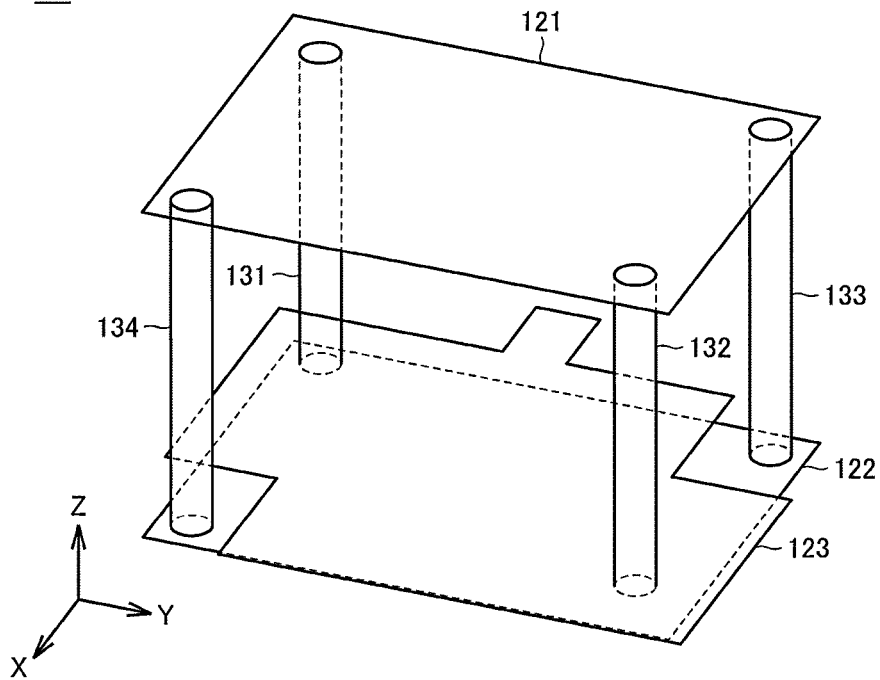
FIG. 9 is a perspective view of a plurality of electrodes of a resonant device according to Preferred Embodiment 2 of the present invention.

FIG. 9 is a perspective view of a plurality of electrodes of a resonant device 12 according to Preferred Embodiment 2. As illustrated in FIG. 9, the resonant device 12 includes a plane electrode 121 (first plane electrode), a plane electrode 122 (second plane electrode), a plane electrode 123 (third plane electrode), a via electrode 131 (first via electrode), a via electrode 132 (second via electrode), a via electrode 133 (third via electrode), and a via electrode 134 (fourth via electrode).

The plane electrode 123 is located between the plane electrodes 121 and 122 in a normal direction (Z-axis direction) of the plane electrode 121. The via electrodes 131 and 132 extend in the Z-axis direction and connect the plane electrodes 121 and 123. The via electrodes 133 and 134 extend in the Z-axis direction and connect the plane electrodes 121 and 122.

Each of the via electrodes 131 and 132 is shorter than each of the via electrodes 133 and 134. A distance between the plane electrodes 123 and 122 is shorter than a distance between the plane electrodes 123 and 121.

The via electrodes 131 to 134 define an inductor. The plane electrodes 122 and 123 are opposed to each other in the Z-axis direction and define a capacitor.

Figure 10:
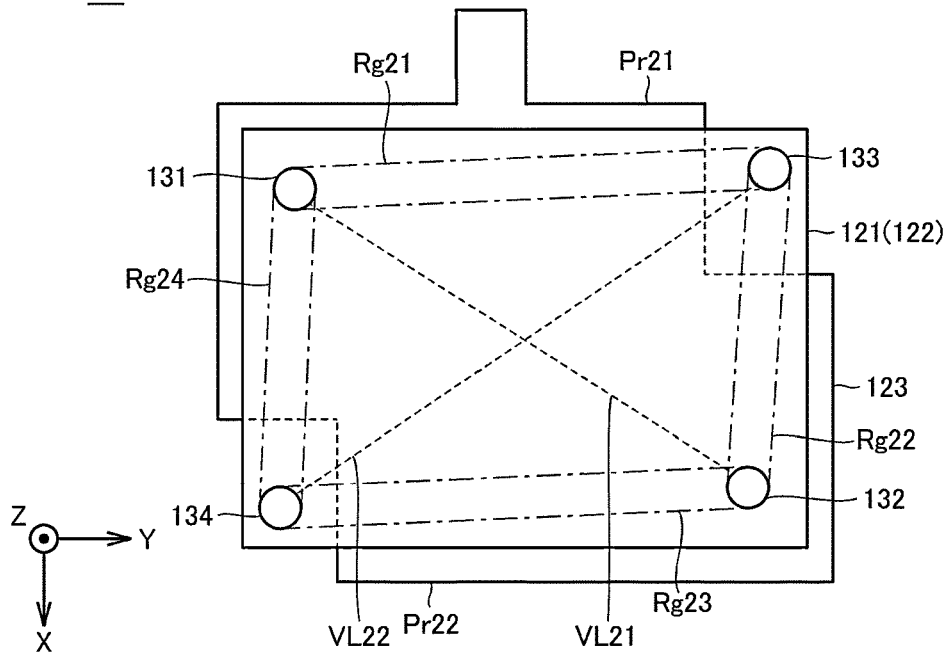
FIG. 10 is a plan view of the resonant device of FIG. 9 when seen in the Z-axis direction.

FIG. 10 is a plan view of the resonant device 12 of FIG. 9 when seen in the Z-axis direction. As illustrated in FIG. 10, when the plane electrode 123 is seen in plan view in the Z-axis direction, the via electrode 131, a range Rg21 between the via electrodes 131 and 133, the via electrode 133, a range Rg22 between the via electrodes 133 and 132, the via electrode 132, a range Rg23 between the via electrodes 132 and 134, the via electrode 134, and a range Rg24 between the via electrodes 134 and 131 form a loop-shaped range. In the loop-shaped range, the via electrodes 131 and 132 connecting the plane electrodes 121 and 123 are positioned alternately with the via electrodes 133 and 134 connecting the plane electrodes 121 and 122. An imaginary line VL21 (first imaginary line) connecting the via electrodes 131 and 132 intersects with an imaginary line VL22 (second imaginary line) connecting the via electrodes 133 and 134.

A direction in which current flows in the via electrode 131 and a direction in which current flows in the via electrode 132 are the same as each other. A direction in which current flows in the via electrode 133 and a direction in which current flows in the via electrode 134 are the same as each other. The direction in which current flows in the via electrode 131 and the direction in which current flows in the via electrode 133 are opposite from each other.

The plane electrode 123 includes a portion Pr21 (first portion) to which the via electrode 131 is connected, and a portion Pr22 (second portion) to which the via electrode 132 is connected. A portion of the portion Pr21 and a portion of Pr22 are not overlapped with the plane electrodes 121 and 122.

Even when misalignment of a relative positional relationship is caused between the plane electrodes 122 and 123 due to manufacturing variations, since the plane electrode 123 has the portion (margin) not overlapped with the plane electrode 122, an area of a portion of the plane electrode 123 overlapping with the plane electrode 122 is prevented from being decreased. Since manufacturing variations in capacitance of the capacitor constituted by the plane electrodes 122 and 123 is reduced or prevented, manufacturing variations in characteristics of the resonant device 12 are reduced or prevented.

Further, since a width of the plane electrode 123 is comparatively large, the capacitance of the capacitor including the plane electrodes 122 and 123 can be made comparatively large. Thus, it is less necessary to bring the plane electrodes 122 and 123 closer to each other in order to increase the capacitance of the capacitor. Since a certain amount of space can be secured between the plane electrodes 122 and 123, a risk of short circuiting between the plane electrodes 121 and 122 by the via electrodes 121 and 122 penetrating the plane electrode 123 during the manufacture of the resonant device 12 can be reduced.

As described above, the resonant device according to Preferred Embodiment 2 and a modification can improve the insertion loss of the resonant device. Moreover, the resonant device according to Preferred Embodiment 2 can reduce manufacturing variations in characteristics of the resonant device, and a risk of short circuiting of the two plane electrodes.

Preferred Embodiment 3

In Preferred Embodiments 1 and 2, the case where each of the number of the via electrodes connecting the first plane electrode and the third plane electrode and the number of the via electrodes connecting the first plane electrode and the second plane electrode is two is described. Each number of the via electrodes may be three or more, for example. In Preferred Embodiment 3, a case where the number of the via electrodes is three is described.

Figure 11:
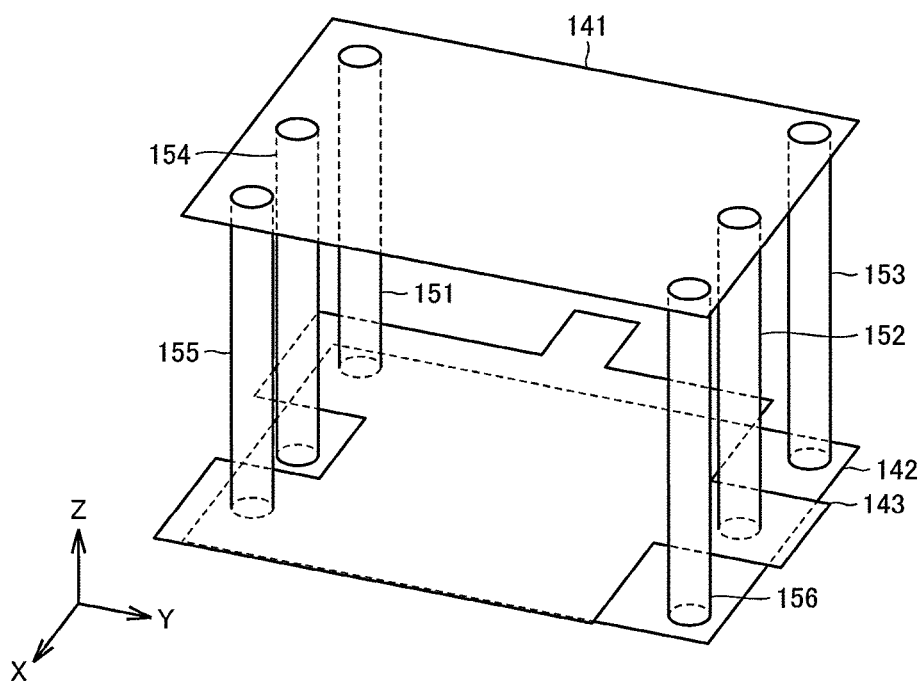
FIG. 11 is a perspective view of a plurality of electrodes of a resonant device according to Preferred Embodiment 3 of the present invention.

FIG. 11 is a perspective view of a plurality of electrodes of a resonant device 13 according to Preferred Embodiment 3. As illustrated in FIG. 11, the resonant device 13 includes a plane electrode 141 (first plane electrode), a plane electrode 142 (second plane electrode), a plane electrode 143 (third plane electrode), a via electrode 151 (first via electrode), a via electrode 152 (second via electrode), a via electrode 153 (third via electrode), a via electrode 154 (fourth via electrode), a via electrode 155 (fifth via electrode), and a via electrode 156 (sixth via electrode).

The plane electrode 143 is located between the plane electrodes 141 and 142 in a normal direction (Z-axis direction) of the plane electrode 141. The via electrodes 151, 152, and 155 extend in the Z-axis direction and connect the plane electrodes 121 and 123. The via electrodes 153, 154, and 156 extend in the Z-axis direction and connect the plane electrodes 141 and 142.

Each of the via electrodes 151, 152, and 155 is shorter than each of the via electrodes 153, 154, and 156. A distance between the plane electrodes 143 and 142 is shorter than a distance between the plane electrodes 143 and 141.

The via electrodes 151 to 156 and an inductor are provided. The plane electrodes 142 and 143 are opposed to each other in the Z-axis direction and constitute a capacitor.

Figure 12:
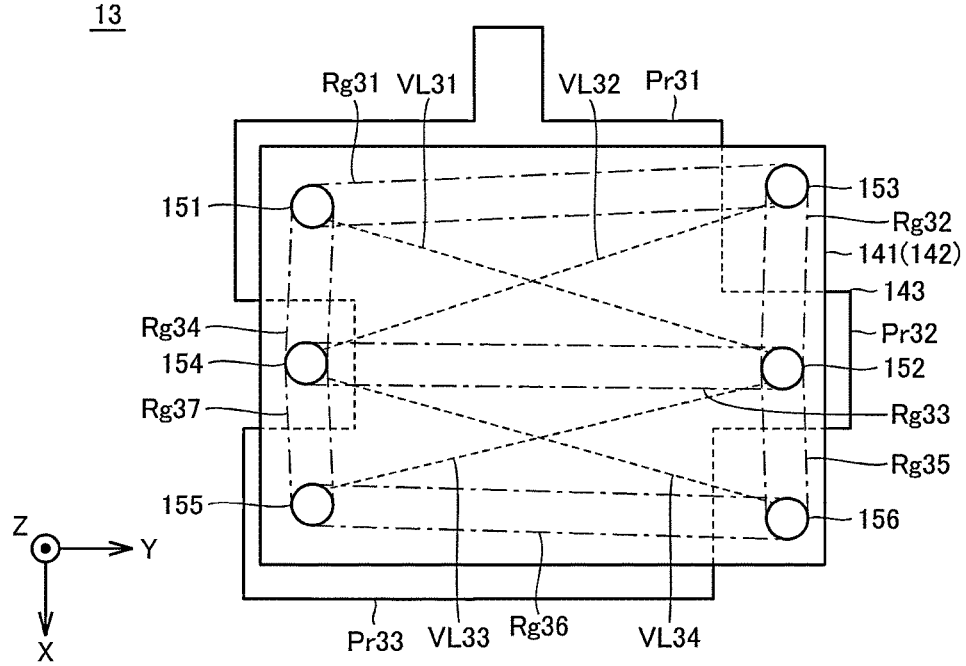
FIG. 12 is a plan view of the resonant device of FIG. 11 when seen in the Z-axis direction.

FIG. 12 is a plan view of the resonant device 13 of FIG. 11 when seen in the Z-axis direction. As illustrated in FIG. 12, when the plane electrode 143 is seen in plan view in the Z-axis direction, the via electrode 151, a range Rg31 between the via electrodes 151 and 153, the via electrode 153, a range Rg32 between the via electrodes 153 and 152, the via electrode 152, a range Rg35 between the via electrodes 152 and 156, the via electrode 156, a range Rg36 between the via electrodes 156 and 155, the via electrode 155, a range Rg37 between the via electrodes 155 and 154, the via electrode 154, and a range Rg34 between the via electrodes 154 and 151 form a loop-shaped range. In the loop-shaped range, the via electrodes 151, 152, and 155 connecting the plane electrodes 141 and 143 are disposed alternately with the via electrodes 153, 154, and 156 connecting the plane electrodes 121 and 122.

An imaginary line VL31 (first imaginary line) connecting the via electrodes 151 and 152 intersects with an imaginary line VL32 (second imaginary line) connecting the via electrodes 153 and 154. An imaginary line VL33 (third imaginary line) connecting the via electrodes 152 and 155 intersects with and an imaginary line VL34 (fourth imaginary line) connecting the via electrodes 154 and 156.

A direction in which current flows in the via electrode 151, a direction in which current flows in the via electrode 152, and a direction in which current flows in the via electrode 155 are the same as each other. A direction in which current flows in the via electrode 153, a direction in which current flows in the via electrode 154, and a direction in which current flows in the via electrode 156 are the same as each other. The direction in which current flows in the via electrode 151 and the direction in which current flows in the via electrode 153 are opposite from each other.

Note that, similarly to Preferred Embodiment 1, the via electrode 151, the range Rg31, the via electrode 153, the range Rg32, the via electrode 152, a range Rg33 between the via electrodes 152 and 154, the via electrode 154, and the range Rg34 also define a loop-shaped range.

The plane electrode 143 includes a portion Pr31 (first portion) to which the via electrode 151 is connected, a portion Pr32 (second portion) to which the via electrode 152 is connected, and a portion Pr33 (third portion) to which the via electrode 155 is connected. A portion of the portion Pr31, a portion of the portion Pr32, and a portion of the portion Pr33 are not overlapped with the plane electrodes 141 and 142.

Similarly to Preferred Embodiment 2, also the resonant device 13 can reduce or prevent manufacturing variations in characteristics of the resonant device 13, and a risk of short circuiting of the plane electrodes 141 and 142.

Further, since each of the number of the via electrodes connecting the plane electrodes 141 and 143 and the number of the via electrodes connecting the plane electrodes 141 and 142 is three, current flowing between the two plane electrodes is distributed more than in Preferred Embodiments 1 and 2. As a result, insertion loss of the resonant device 13 can be further improved compared to Preferred Embodiments 1 and 2.

As described above, the resonant device according to Preferred Embodiment 3 can further improve insertion loss of the resonant device compared to Preferred Embodiments 1 and 2. Further, the resonant device according to Preferred Embodiment 3 can reduce manufacturing variations in characteristics of the resonant device, and a risk of short circuiting of the two plane electrodes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resonant device comprising:
    a multilayer body;
    a first plane electrode provided to the multilayer body;
    a second plane electrode provided to the multilayer body;
    a third plane electrode provided to the multilayer body and located between the first plane electrode and the second plane electrode in a normal direction of the first plane electrode;
    a first via electrode and a second via electrode connecting the first plane electrode and the third plane electrode; and
    a third via electrode and a fourth via electrode connecting the first plane electrode and the second plane electrode; wherein
    when the first plane electrode is seen in a plan view in the normal direction, a first imaginary line connecting the first via electrode and the second via electrode intersects with a second imaginary line connecting the third via electrode and the fourth via electrode; and
    the second plane electrode and the third plane electrode define a capacitor.

2. The resonant device according to claim 1, wherein
    a direction in which current flows in the first via electrode and a direction in which current flows in the second via electrode are the same as each other;
    a direction in which current flows in the third via electrode and a direction in which current flows in the fourth via electrode are the same as each other; and
    the direction in which current flows in the first via electrode and the direction in which current flows in the third via electrode are opposite from each other.

3. The resonant device according to claim 1, wherein
    a terminal is provided in or on the third plane electrode; and
    when the third plane electrode is seen in the plan view in the normal direction, the terminal is not overlapped with the first plane electrode and the second plane electrode.

4. The resonant device according to claim 1, wherein
    the third plane electrode includes a first portion to which the first via electrode is connected, and a second portion to which the second via electrode is connected; and
    when the third plane electrode is seen in the plan view in the normal direction, a portion of the first portion and a portion of the second portion are not overlapped with the second plane electrode.

5. The resonant device according to claim 1, further comprising:
    a fifth via electrode connecting the first plane electrode and the third plane electrode; and
    a sixth via electrode connecting the first plane electrode and the second plane electrode; wherein
    when the first plane electrode is seen in the plan view in the normal direction, a third imaginary line connecting the second via electrode and the fifth via electrode intersects with a fourth imaginary line connecting the fourth via electrode and the sixth via electrode.

6. The resonant device according to claim 5, wherein
    a direction in which current flows in the first via electrode, a direction in which current flows in the second via electrode, and a direction in which current flows in the fifth via electrode are the same as each other;
    a direction in which current flows in the third via electrode, a direction in which current flows in the fourth via electrode, and a direction in which current flows in the sixth via electrode are the same as each other; and
    the direction in which current flows in the first via electrode and the direction in which current flows in the third via electrode are opposite from each other.

7. The resonant device according to claim 5, wherein
    the first via electrode, the fourth via electrode, and the fifth via electrode are positioned along a first direction perpendicular or substantially perpendicular to an extending direction of the first via electrode; and
    the third via electrode, the second via electrode, and the sixth via electrode are positioned along a second direction perpendicular or substantially perpendicular to the extending direction.

8. The resonant device according to claim 5, wherein
    the third plane electrode further includes a third portion to which the fifth via electrode is connected; and
    when the third plane electrode is seen in the plan view in the normal direction, a portion of the third portion is not overlapped with the second plane electrode.

9. A filter comprising:
    the resonant device according to claim 1.

10. The filter according to claim 9, wherein
a direction in which current flows in the first via electrode and a direction in which current flows in the second via electrode are the same as each other;
a direction in which current flows in the third via electrode and a direction in which current flows in the fourth via electrode are the same as each other; and
the direction in which current flows in the first via electrode and the direction in which current flows in the third via electrode are opposite from each other.

11. The filter according to claim 9, wherein
a terminal is provided in or on the third plane electrode; and
when the third plane electrode is seen in the plan view in the normal direction, the terminal is not overlapped with the first plane electrode and the second plane electrode.

12. The filter according to claim 9, wherein
the third plane electrode includes a first portion to which the first via electrode is connected, and a second portion to which the second via electrode is connected; and
when the third plane electrode is seen in the plan view in the normal direction, a portion of the first portion and a portion of the second portion are not overlapped with the second plane electrode.

13. The filter according to claim 9, further comprising:
a fifth via electrode connecting the first plane electrode and the third plane electrode; and
a sixth via electrode connecting the first plane electrode and the second plane electrode; wherein
when the first plane electrode is seen in the plan view in the normal direction, a third imaginary line connecting the second via electrode and the fifth via electrode intersects with a fourth imaginary line connecting the fourth via electrode and the sixth via electrode.

14. The filter according to claim 13, wherein
a direction in which current flows in the first via electrode, a direction in which current flows in the second via electrode, and a direction in which current flows in the fifth via electrode are the same as each other;
a direction in which current flows in the third via electrode, a direction in which current flows in the fourth via electrode, and a direction in which current flows in the sixth via electrode are the same as each other; and
the direction in which current flows in the first via electrode and the direction in which current flows in the third via electrode are opposite from each other.

15. The filter according to claim 14, wherein
the first via electrode, the fourth via electrode, and the fifth via electrode are positioned along a first direction perpendicular or substantially perpendicular to an extending direction of the first via electrode; and
the third via electrode, the second via electrode, and the sixth via electrode are positioned along a second direction perpendicular or substantially perpendicular to the extending direction.

16. The filter according to claim 14, wherein
the third plane electrode further includes a third portion to which the fifth via electrode is connected; and
when the third plane electrode is seen in the plan view in the normal direction, a portion of the third portion is not overlapped with the second plane electrode.

17. A module comprising:
the filter according to claim 9.

18. The module according to claim 17, wherein
a direction in which current flows in the first via electrode and a direction in which current flows in the second via electrode are the same as each other;
a direction in which current flows in the third via electrode and a direction in which current flows in the fourth via electrode are the same as each other; and
the direction in which current flows in the first via electrode and the direction in which current flows in the third via electrode are opposite from each other.

19. The module according to claim 17, wherein
a terminal is provided in or on the third plane electrode; and
when the third plane electrode is seen in the plan view in the normal direction, the terminal is not overlapped with the first plane electrode and the second plane electrode.

20. The module according to claim 17, wherein
the third plane electrode includes a first portion to which the first via electrode is connected, and a second portion to which the second via electrode is connected; and
when the third plane electrode is seen in the plan view in the normal direction, a portion of the first portion and a portion of the second portion are not overlapped with the second plane electrode.

* * * * *